United States Patent
Chang (10) Patent No.: US 12,557,696 B2
(45) Date of Patent: Feb. 17, 2026

(54) THREE-DIMENSIONAL INTEGRATION OF PROCESSING CHIPLET AND STATIC RANDOM-ACCESS MEMORY (SRAM) CHIPLETS

(71) Applicant: Marvell Asia Pte Ltd, Singapore (SG)

(72) Inventor: Runzi Chang, Saratoga, CA (US)

(73) Assignee: Marvell Asia Pte Ltd, Singapore (SG)

( * ) Notice: Subject to any disclaimer, the term of this patent is extended or adjusted under 35 U.S.C. 154(b) by 902 days.

(21) Appl. No.: 17/752,917

(22) Filed: May 25, 2022

(65) Prior Publication Data

US 2022/0384408 A1 Dec. 1, 2022

Related U.S. Application Data (60) Provisional application No. 63/194,812, filed on May 28, 2021.

(51) Int. Cl.
| | | |
|---|---|---|
| *G11C 16/04* | (2006.01) | |
| *H01L 25/00* | (2006.01) | |
| *H01L 25/065* | (2023.01) | |
| *H01L 25/18* | (2023.01) | |

(52) U.S. Cl.
CPC .......... *H01L 25/18* (2013.01); *H01L 25/0657* (2013.01); *H01L 25/50* (2013.01); *H01L 2225/06513* (2013.01); *H01L 2225/06541* (2013.01)

(58) Field of Classification Search
CPC ..... H01L 25/18; H01L 25/0657; H01L 25/50; H01L 2225/06513; H01L 2225/06541
See application file for complete search history.

(56) References Cited

U.S. PATENT DOCUMENTS

| | | | |
|---|---|---|---|
| 6,041,008 A * | 3/2000 | Marr ................. | G11C 11/005 |
| | | | 365/225.7 |
| 8,370,654 B1 | 2/2013 | Hasko et al. | |
| 9,589,966 B2 * | 3/2017 | Hsu ..................... | H10D 89/10 |
| 2013/0235652 A1* | 9/2013 | Liaw ................... | H10D 30/62 |
| | | | 257/E21.632 |

OTHER PUBLICATIONS

Chang et al., U.S. Appl. No. 17/071,910, filed Oct. 15, 2020.
Taiwan Office Action, Application No. 111119759, dated Nov. 28, 2025.

* cited by examiner

*Primary Examiner* — Pho M Luu
(74) *Attorney, Agent, or Firm* — Meitar Patents Ltd.; Daniel Kligler (57) ABSTRACT

An electronic device, includes: (i) a processing chiplet configured to process data and having a first side and a second side, (ii) one or more first static random-access memory (SRAM) chiplets disposed on the first side of the processing chiplet and configured to store a first portion of the data, (iii) one or more second SRAM chiplets disposed on the second side of the processing chiplet and configured to store a second portion of the data, (iv) one or more first electrical terminals disposed on the first side of the processing chiplet and configured to electrically connect between the first side of the processing chiplet and the first SRAM chiplets, and (v) one or more second electrical terminals disposed on the second side of the processing chiplet and configured to electrically connect between the second side of the processing chiplet and the second SRAM chiplets.

18 Claims, 4 Drawing Sheets

THREE-DIMENSIONAL INTEGRATION OF PROCESSING CHIPLET AND STATIC RANDOM-ACCESS MEMORY (SRAM) CHIPLETS

CROSS-REFERENCE TO RELATED APPLICATIONS

This application. claims the benefit of U.S. Provisional Patent Application 63/194,812, filed May 28, 2021, whose disclosure is incorporated herein by reference.

FIELD OF THE DISCLOSURE

The present invention relates generally to electronic devices, and particularly to methods and systems for improving the performance of electronic devices by stacking together processing chiplets and static random-access memory (SRAM) chiplets.

BACKGROUND

Various techniques are known in the art for integrating processing and static random-access memory (SRAM) capabilities in an electronic device.

The description above as presented as a general overview of related art in this field and should not be construed as an admission that any of the information it contains constitutes prior art against the present patent application.

SUMMARY

An embodiment that is described herein provides an electronic device, including: (i) a processing chiplet configured to process data and having a first side and a second side, (ii) one or more first static random-access memory (SRAM) chiplets disposed on the first side of the processing chiplet and configured to store a first portion of the data, (iii) one or more second SRAM chiplets disposed on the second side of the processing chiplet and configured to store a second portion of the data, (iv) one or more first electrical terminals disposed on the first side of the processing chiplet and configured to electrically connect between the first side of the processing chiplet and the one or more first SRAM chiplets, and (v) one or more second electrical terminals disposed on the second side of the processing chiplet and configured to electrically connect between the second side of the processing chiplet and the one or more second SRAM chiplets.

In some embodiments, the electronic device includes one or more through-silicon vias (TSVs) formed through at least part of the processing chiplet and configured to conduct electrical signals between the processing chiplet and at least one of the first and second electrical terminals. In other embodiments, the one or more first SRAM chiplets include at least first and second given SRAM chiplets, and the first given SRAM chiplet includes: (i) a first given side, which is facing the first side of the processing chiplet and is connected to the one or more first electrical terminals, and (ii) a second given side, which is facing the second given SRAM chiplet that is stacked on the first given SRAM chiplet. In yet other embodiments, the first given side of the first given SRAM chiplet is disposed on the one or more first electrical terminals that are configured to exchange at least part of the first portion of the data between the processing chiplet and the first given SRAM chiplet.

In some embodiments, the electronic device includes one or more third electrical terminals disposed on the second side of the first given SRAM chiplet and configured to electrically connect between the second side of the first given SRAM chiplet and the second given SRAM chiplet. In other embodiments, the electronic device includes one or more given TSVs formed through at least part of the first given SRAM chiplet and configured to conduct electrical signals between the processing chiplet and at least one of the first and second given SRAM chiplets. In yet other embodiments, at least one of the TSVs and at least one of the given TSVs differ from one another.

In some embodiments, the at least one of the TSVs: (i) has a first length through at least part of the processing chiplet, (ii) has a first width along the first side of the processing chiplet, and (iii) contains a first metal layer having a first volume within the processing chiplet, and the at least one of the given TSVs: (a) has a second length through at least part of the first Given SRAM chiplet, (b) has a second width along the third side of the first given SRAM chiplet, and (c) contains a second metal layer having a second volume within the first given SRAM chiplet, and, at least one of the first and second: (1) lengths, (2) widths, (3) metal layers, and (4) volumes, differ from one another. In other embodiments, the processing chiplet is formed on a first substrate and includes first metal interconnects, and at least the first and second given SRAM chiplets is formed on a second substrate and includes second metal interconnects. In yet other embodiments, the first side includes a first surface of the first substrate and the second side includes the first metal interconnects, and the third side includes: (i) a second surface of the second substrate, or (ii) the second metal interconnects.

In some embodiments, the first and second SRAM chiplets include first and second numbers of SRAM chiplets, and the first and second numbers differ from one another. In other embodiments, the first and second SRAM chiplets include first and second numbers of SRAM chiplets, and the first and second numbers are equal to one another.

In some embodiments, the electronic device includes at least one of: (i) a first circuit board (CB) substrate facing a first outer SRAM chiplet of the first SRAM chiplets, (ii) a second CB substrate facing a second outer SRAM chiplet of the second SPAS chiplets, and (iii) one or more third CB substrates facing one or more edges of the electronic device, respectively, at least one of the edges is orthogonal to at least one of the first, second and third sides. In other embodiments, the electronic device includes third electrical terminals, which are disposed on at least one of the first, second and third CB substrates, and are configured to conduct signals between: (i) at least one of the first, second and third CB substrates, and (ii) at least one of the (a) processing chiplet, (b) one or more of the first SRAM chiplets, and (c) one or more of the second SRAM chiplets.

There is additionally provided, in accordance with an embodiment of the present invention, a method for producing an electronic device, the method including disposing, on a first side of a processing chiplet having the first side and a second side, one or more first static random-access memory (SRAM) chiplets. One or more second SRAM chiplets are disposed on the second side of the processing chiplet. One or more first electrical terminals are disposed on the first side of the processing chiplet for electrically connecting between the first side of the processing chiplet and the one or more first SRAM chiplets. One or more second electrical terminals are disposed on the second side of the processing chiplet for electrically connecting between the second side of the processing chiplet and the one or more second SRAM chiplets.

In some embodiments, disposing the one or more first SRAM chiplets include disposing at least first and second given SRAM chiplets, the first given SRAM chiplet includes: (i) a first given side, which is disposed for facing the first side of the processing chiplet and is connected to the one or more first electrical terminals, and (ii) a second given side, which is disposed for facing the second given SRAM chiplet that is stacked on the first given SRAM chiplet In other embodiments, the method includes testing at least one of the: (i) processing chiplet, (ii) one or more of the first SRAM chiplets, (iii) one or more of the second SRAM chiplets, (iv) a stack including the processing chiplet electrically connected to at least one of the first and second SRAM chiplets, and (v) one or more circuit board (CB) substrates electrically connected to the stack.

The present disclosure will be more fully understood from the following detailed description of the embodiments thereof, taken together with the drawings in which:

DETAILED DESCRIPTION OF EMBODIMENTS

Electronic devices, such as central processing units (CPUs), application-specific integrated circuits (ASIC) and system-on-chip (SoC) devices, typically integrate (i) logic functions for processing data, and (ii) static random-access memory (SRAM) functions for performing high-speed storage operations on data processed by the logic function.

Improvements in fabrication technologies, such as reduced dimensions and the introduction of fin field-effect transistors (finFET), reduce the transistor-cost in the logic functions. The scaling rate of the SRAM functions, however, is substantially slower, and therefore, limit the electronic performance and/or cost reduction of the integrated electronic device. In other words, a SoC comprising a CPU and SRAM may have insufficient processing and/or memory resources, or may require increased size and cost of the SoC for incorporating the required processing and/or memory resources.

One possible workaround is to replace at least some of the SRAM functions with other memory functions, such as dynamic random-access memory (DRAM). This configuration, however, may limit the performance of the integrated electronic device, because the communication data rate between logic and DRAM is about ten times (10×) slower than that between logic and a corresponding SRAM. Another possible workaround is to integrate different logic and SRAM chips side-by-side using a multi chip module (MCM) configuration. However, the footprint of MCM configured devices is typically substantially larger than that of the SoC, and the number of channels for routing signals between the two or more chips, is insufficient for obtaining the required performance of the MCM.

Embodiments of the present disclosure that are described herein, provide techniques for improving the cost and/or electronic performance of such electronic devices, by stacking multiple SRAM chiplets on at least two sides of a logic chiplet, also referred to herein as a processing chiplet configured to process data In the context of the present disclosure and in the claims, the term "chiplet" refers to an integrated circuit (IC) that contains a well-defined subset of functionality. Each chiplet is configured to be vertically integrated with other chiplets on an interposer in a single package, in an embodiment.

In some embodiments, an electronic device comprises a set of integrated chiplets implemented in an assembly of one or more logic chiplets and multiple SRAM chiplets. In the present example, an electronic device comprises (i) a processing chiplet configured to process data and having a first side and a second side, (ii) one or more first SRAM chiplets disposed on the first side of the processing chiplet and configured to store a first portion of the data, and (iii) one or more second SRAM chiplets disposed on the second side of the processing chiplet and configured to store a second portion of the data processed in the processing chiplet.

In some embodiments, each chiplet comprises: (i) a substrate having an active side (having active elements described herein) and a passive side (that does not have active elements), (ii) active elements, such as transistors, formed in the active side of the substrate, and (iii) metal connections formed over the transistors and configured to interconnect between the transistors and between the chiplet and electrical terminals, such as bumps or micro-bumps, disposed between adjacent stacked chiplets. The first side of the chiplet comprises the surface of the passive side of the substrate, and is also referred to herein as a backside or back of the chiplet, and the second side of the chiplet (also referred to herein as a frontside or a front of the chiplet) comprises the metal connections configured to interconnect between elements of the chiplet (e.g., between doped regions in one or more transistors) in a desired manner. In such embodiments, each pair of the chiplets may be arranged in various configurations, such as face-to-face, back-to-back, or face-to-back.

The substrate of the chiplet typically comprises a single-crystal semiconductor substrate having low electrical conductivity. In some embodiments, one or more through-silicon vias (TSVs) are formed through at least the substrate of at least one of and typically each of the chiplets. The TSVs are configured to conduct electrical signals between the metal connections of a pair of chiplets stacked in the back-to-back or face-to-face configurations.

In some embodiments, a specified electronic device comprises a specified processing chiplet, and first and second specified SRAM chiplets facing the first and second sides of the specified processing chiplet, respectively. In such embodiments, the specified electronic device comprises: (i) a first set of bumps disposed between the first side of the specified processing chiplet and the first specified SRAM chiplet, and (ii) a second set of bumps disposed between the second side of the specified processing chiplet and the second specified SRAM chiplet. Note that in this configuration, the specified processing chiplet is stacked: (i) back-to-face or back-to-back with the first specified SRAM chiplet, and (ii) face-to-face or face-to-back with the second specified SRAM chiplet (depending on the side-arrangement of the first and second specified SRAM chiplets.

In some embodiments, in the face-to-face configuration: (i) one or all of the bumps are formed between (pads of) the metal connections of the specified processing chiplet and second specified SRAM chiplet, (ii) one or more of the bumps may be formed between a TSV and metal connections, and (iii) one or more of the bumps may be formed between two TSVs of the respective two stacked chiplets (e.g, the specified processing chiplet and the second specified SRAM chiplet). In the face-to-back configuration, one or more of the bumps are formed between the TSVs, and one or more of the bumps may be formed between a TSV and the metal connections. In the back-to-back configuration, all the bumps are formed between two TSVs of the respective two stacked chiplets, as described above. Embodiments related to the various arrangements of the chiplets, TSVs and bumps are described in detail in FIGS. 1, 2 and 3 below.

In some embodiments, stacking any suitable number of SRAM chiplets on both sides of the processing chiplet provides the electronic device with sufficient SRAM resources with respect to the processing capability of the processing chiplet. The number of stacked SRAM chiplets may be equal in both sides of the processing chiplet, or a different number of SRAM chiplets may be stacked in different sides of the processing chiplet. Moreover, the electronic device may comprise one or more additional processing chiplets disposed between the stacks of SRAM chiplets.

In some embodiments, the electronic device comprises one or more circuit board (CB) substrates electrically connected, e.g., via balls, to one or more of the chiplets. In a first example configuration, the surface of a first CB substrate is facing a surface of an outer SRAM chiplet of the stacked SRAM chiplets, and is electrically connected to the outer SRAM chiplet using the balls. In a second example configuration, the surface of a second CB substrate is disposed orthogonal to the face and back sides of the processing and SRAM chiplets, and is electrically connected (e.g., via the halls) to the metal connections of some or all of the processing and SRAM chiplets. In a third example configuration, the electronic device may comprise up to six CB substrates electrically connected (e.g., via the balls) to six facets, respectively of the stack of processing and SRAM chiplets. These example configurations improve the bandwidth and customization of the electronic device, depending on the specification of processing and memory capabilities, and the respective implemented number of processing and SRAM chiplets stacked together in the electronic device. These embodiments are illustrated and described in detail in FIGS. 1-3 below.

In some embodiments, at least one of the processing chiplets has a redundancy of CPU cores, so that given data intended to be processed in a first CPU core that became non-functional, may be transferred for processing in a second CPU core. In a stack of chiplets having one or more processing chiplets, this redundancy of CPU cores can improve (i) the yield in production, and (ii) the reliability during the operation of such stack of chiplets. One implementation of redundancy in CPU cores is described, for example, in U.S. patent application Ser. No. 17/071,910 (to Chang et al., filed Oct. 15, 2020), whose disclosure is incorporated herein by reference. Similarly, the SRAM chiplets typically have redundancy of memory blocks, so that in response to identifying that a first memory block is not functioning, data intended to be stored in the first memory block, may be stored in a second different memory block.

In some embodiments, the redundancy in CPU cores and in memory blocks, together with the testing of each chiplet, CB substrate and two or more stacked chiplets, improve the yield and reduce the cost associated with the fabrication of such electronic devices. The fabrication and testing processes are further described in detail in FIG. 4 below.

The description above is presented as a general overview of embodiments of the present disclosure, which are described in detail herein.

Figure 1:
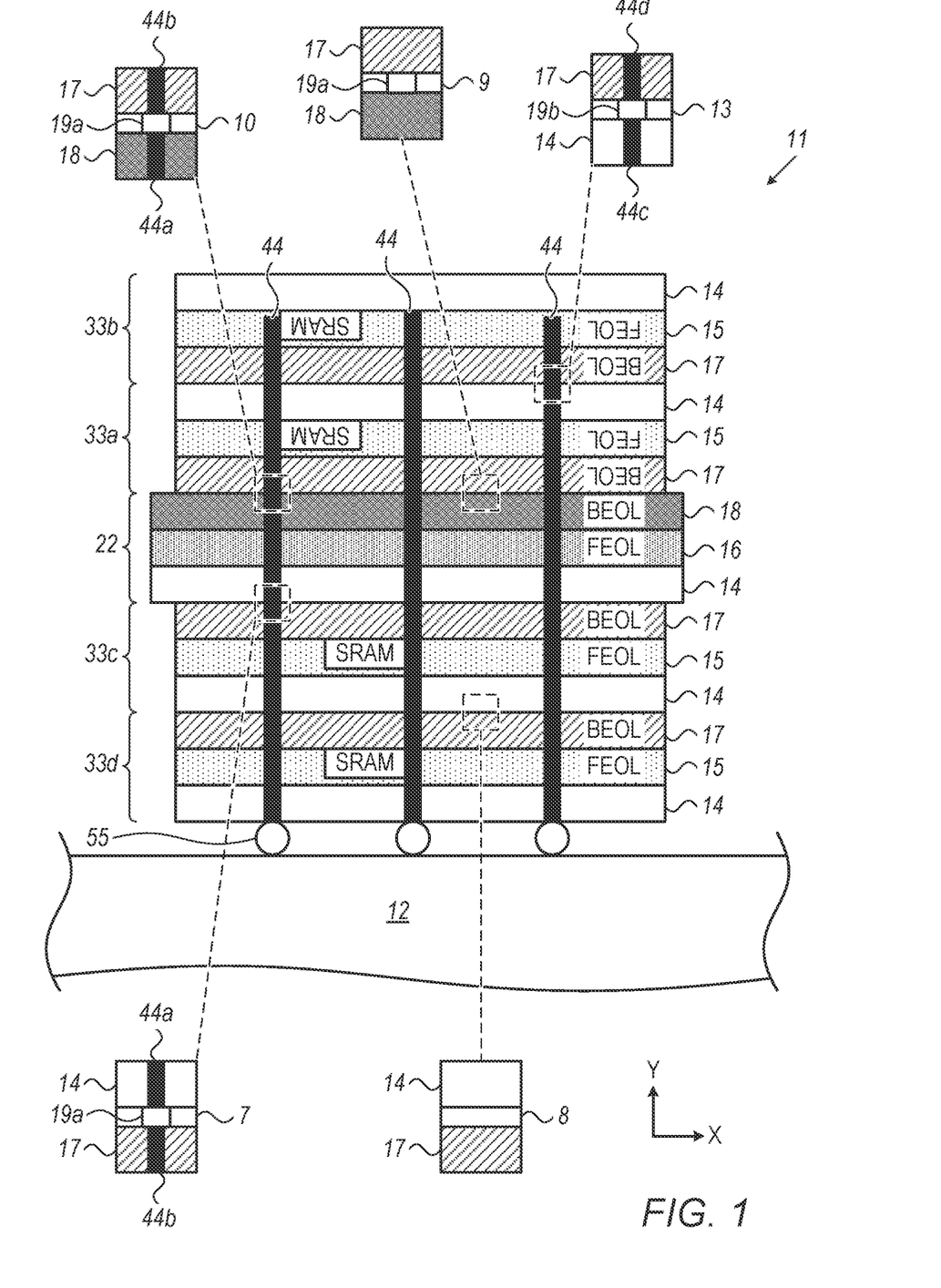
FIGS. 1, 2 and 3 are schematic, sectional views of respective electronic devices, in accordance with embodiments that are described herein.

FIG. 1 is a schematic, sectional view of an electronic device 11, in accordance with an embodiment that is described herein.

In some embodiments, electronic device 11 comprises a processing chiplet (PC) 22 and multiple static random-access memory (SRAM) chiplets (SCs) 33*a*, 33*b*, 33*c* and 33*d* PC 22 comprises a substrate 14, having an active side, also referred to herein as front-end of line (FEOL) 16, and a passive side. In the present example, substrate 14 comprises a semiconductor wafer, such as a wafer made from a single crystal of silicon.

In some embodiments, active elements, such as transistors, are formed in the active side of substrate 14. For example, well and source/drain S/D of the transistors are formed using ions implantation in the active side, and gates, such as fin field-effect transistor (finFET) gates, are formed (e.g., using diffusion and deposition processes) on the surface of the substrate, so that FEOL 16 comprises the wells, S/Ds and gates of the transistors (and optionally other active elements (e.g., diodes) and/or passive elements (e.g., resistors and capacitors) of FEOL 16.

In some embodiments, electronic device 11 comprises metal connections, also referred to herein as back-end of line (BEOL) 18, formed over the transistors of FEOL 16 and configured to interconnect between the transistors of FEOL 16, so as to carry out processing functions in PC 22. The terms FEOL and BEOL are related to the fabrication process of the chiplets, in which the transistors formed in the front end of the production line, and the interconnects are formed in the back end of the production line. Note that even though part of FEOL 16 is formed within substrate 14, the term "substrate 14" refers to the passive side of the substrate, and the term FEOL 16 refers to the active side of the substrate and the transistors formed therein.

In some embodiments, each SC 33 comprises (i) a substrate 14, which is typically similar to substrate 14 of PC 22 and having the passive side thereof, (ii) FEOL 15 comprising the active side of the substrate having transistors and other active and passive elements formed therein, and (iii) FEOL 17 having metal connections for connecting between the transistors of FEOL 15. Note that both FEOLs 15 and 16 have transistors arranged in different configurations. For example, the transistors of FEOL 15 are arranged in repetitive memory cells (e.g., typically about four or six transistors arranged in flip-flip circuitries), whereas the transistors of FEOL 16 are arranged in several types of logic libraries that typically are not forming a repetitive pattern.

In some embodiments, in state-of-the-art process nodes FEOL 16 may comprise between about 10 billion and 80 billion transistors (depending on the chiplet size), and therefore, BEOL 18 typically comprises between about eight and twenty metal layers in order to connect between the FEOL transistors. SRAM chiplets, however, typically comprise a few millions of cells, and therefore, BEOL 17 require a much smaller number of metal layers, e.g., between about two and six metal layers. Due to the different configurations of the FEOL and BEOL of the processing and SRAM chiplets, the FEOLs and BEOLs of PC 22 and SCs 33 receive different numerals, whereas the passive side of the substrate is similar, and therefore, receives the same numeral 14.

In some embodiments, electronic device 11 comprises one or more (typically a few hundreds or thousands of) through-silicon vias (TSVs) 44 that are formed, along a Y-axis, through at least part of the thickness of PC 22 and SCs 33. TSVs 44 are configured to conduct electrical signals between the chiplets, and more specifically, between PC 22 and SCs 33. In the example of FIG. 1, TSVs 44 are formed through the entire thickness of all the chiplets but SC 33b in which TSVs 44 are not formed in substrate 14. In other embodiments, TSVs 44 may be formed only through substrates 14 and FEOLs 15 and 16, so that the metal layers of the BEOLs are used for conducting electrical signals together with TSVs 44.

In the context of the present disclosure and in the claims, the surface of the passive side of substrate 14 of the chiplets is also referred to herein as the back of the chiplet, and the outer surface of BEOLs 17 and 18 also referred to herein as the front of the chiplet. In such embodiments, each pair of the chiplets of electronic device 11 may be arranged in various configurations, such as face-to-face, back-to-back, or face-to-back. In the example of FIG. 1, SCs 33a and 33b are flipped, so that PC 22 and SC 33a are arranged in a face-to-face configuration (i.e., FEOLs 17 and 18 are facing one another), and all other pairs of chiplets are arranged in a face-to-back configuration (i.e., pairs of BEOL 17 and substrate 14 are facing one another).

Reference is now made to insets 7, 8, 9, 10 and 13 showing interfaces between chiplets of electrical device 11.

In some embodiments, electronic device 11 comprises multiple electrical terminals configured to electrically connect between respective pairs of chiplets. In the present example, these electrical terminals comprise bumps or micro-bumps, referred to herein as bumps 19, which are made from copper and having a width (e.g., along the X-axis) between about 10 μm and 30 μm, and a height (along the Y-axis) between about 5 μm and 20 μm. Note that TSVs 44 are configured to conduct the electrical signals, for example, between processing chiplet 22 and at least one of bumps 19 described in detail hereinafter.

In the example of insets 7 and 10, bumps 19a are configured to electrically connect between (i) TSVs 44a of PC 22, and (ii) TSVs 44b of SCs 33a and 33c, respectively, which are positioned on both sides of PC 22. In the example of inset 9, bump 19a is configured to electrically connect between BEOLs 18 and 17 of PC 22 and SC 33a, respectively. In the section shown in inset 8, however, the face-to-back configuration does not have a TSV, so that no electrical signals are conducted, and therefore, this section does not require a bump. Note that when the BEOLs of both chiplets are facing one another, the bumps are used for conducting electrical signals between the metal connectors, and optionally conduct live pads (not shown), of the BEOLs even without having TSVs in the respective sections.

With reference back to inset 8, in other embodiments, bumps 19 may be formed for mechanically supporting the interface between substrate 14 and BEOL 17. Such bumps may be referred to as dummy bumps that do not conduct electrical signals. With reference back to inset 13, a bump 19b is formed between: (i) TSV 44d formed through BEOL 17 of SC 33b, and (ii) TSV 44c formed through SC 33a.

In some embodiments, TSVs 44a, 44b, 44c and 44d are all similar. In other embodiments, each TSV 44 is required to conduct signals having different properties, such as voltage and current, and therefore, two or more of TSVs 44a, 44b, 44c and 44d may differ from one another. Each TSV 44 has a predefined length along the Y-axis, width (e.g., diameter) along the X-axis, and other structural properties (such as sidewall angle). Moreover, each TSV 44 is filled with a suitable type of metal (e.g., copper alloy) having a suitable texture, volume and sublayers. For example, BEOL 17 is thinner (along the Y-axis) than BEOL 18 (for having less metal layers as described above), and therefore, TSV 44b is shorter than TSV 44a. Similarly, TSV 44d is shorter (along the Y-axis) than TSV 44c, and may comprise: (i) a different copper alloy, and/or (ii) a different width, for conducting signals having higher respective current and/or voltage between PC 22 and SC 33b.

Similarly, in some embodiments, bumps 19a and 19b are all similar. In other embodiments, at least two bumps 19a and 19b differ from one another, for example, in length and/or width, along the Y- and X-axes, respectively, and/or in the type of one or more layers thereof. As described for the TSVs, the features and structure of each bump 19 is determined based on the properties of the electrical signals conducted therethrough.

In some embodiments, differences in some features of the TSVs and bumps (e.g., different materials) require different respective process operations that increase the fabrication costs of electronic device 11. Other differences, such as in the width (along the X-axis) of different bumps and/or TSVs, may be incorporated in the same process operation using a suitable design or the respective lithography masks.

In some embodiments, electronic device 11 comprises a suitable substrate, such as an interposer or any other suitable type of a packaging substrate. In the present example, the substrate comprises a printed circuit board (CB) substrate, referred to herein as a CB 12, which is configured to conduct signals between electronic device 11 and external electronic devices (not shown) of an electronic system. Electronic device 11 comprises multiple balls 55 configured to conduct the electrical signals between TSVs 44 and CB 12. In the present example, CB 12 is facing an outer chiplet, e.g., SC 33d, and balls 55 are disposed between CB 12 and SC 33d.

In some embodiments, balls 55 are made from any suitable (typically soldering) material, have a typical diameter between about 50 μm and 100 μm, and are formed using any suitable ball-grid array (BGA) soldering process, or any other suitable process. In other embodiments, instead of balls 55, electronic device 11 may comprise a land-grid array (LGA), a pin-grid array (PGA), or any other suitable type of electrical terminals formed between CB 12 and one or more of the outer chiplets of electronic device 11.

Note that using a vertical three-dimensional (3D) integration of processing chiplet 22 and multiple SRAM chiplets 33 improves the bandwidth and customization of electronic device 11, depending on the specification of the processing and memory capabilities of the particular electronic device. In the present example, electronic device 11 comprises one processing chiplet and four SRAM chiplets 33, but in other embodiments, another electronic device may comprise at least one of: (i) multiple processing chiplets, and (ii) a different number of SRAM chiplets disposed on both sides and/or on different sides of the processing chiplet. For example, the electronic device may comprise three SRAM chiplets 33 stacked on a first side of PC 22, and two SRAM chiplets 33 stacked on the second side of the electronic device. Moreover, two or more of the SRAM chiplets may differ from one another, and the orientation of the SRAM chiplets (face and back) may be altered in order to obtain the required electrical properties of the respective electronic device.

The configuration of electronic device 11 is provided by way of example, in order to illustrate certain problems that are addressed by embodiments of the present invention and to demonstrate the application of these embodiments in enhancing the performance of such an electronic device. Embodiments of the present invention, however, are by no means limited to this specific sort of example electronic device, and the principles described herein may similarly be applied to other sorts of electronic devices shown, for example, in FIGS. 2 and 3 below.

Figure 2:
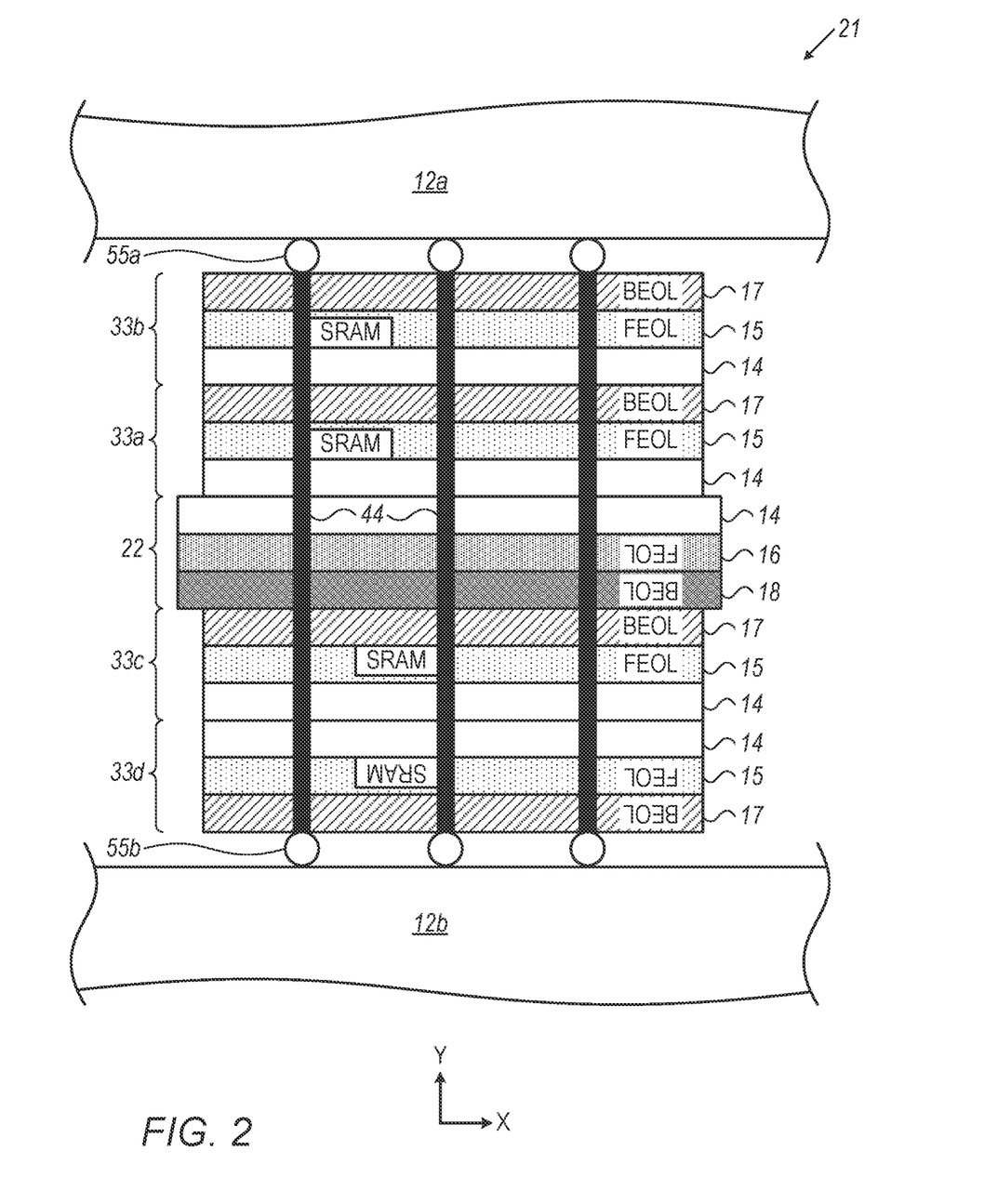

FIG. 2 is a schematic, sectional view of an electronic device 21, in accordance with another embodiment that is described herein.

In some embodiments, electronic device 21 comprises CBs 12a and 12b facing SCs 33b and 33d, respectively. The plurality of CBs 12 reduces the distance required to conduct at least some of the electrical signals, and therefore, may improve the bandwidth and data rate of the data being processed within electronic device 21 and/or the data transmitted between electronic device 21 and external devices of the electronic system mentioned in FIG. 1 above. Moreover, electronic device 21 comprises balls 55a and 55b for conducting electrical signals between (i) TSVs 44 and (ii) CBs 12a and 12b.

In some embodiments, PC 22 of electronic device 21 is flipped (upside-down) compared to the orientation of PC 22 in electronic device 11 of FIG. 1 above. Moreover, the orientation of SCs 33a, 33b and 33d is also flipped In this configuration PC 22 and SC 33c are arranged in a face-to-face configuration, SCs 33a and 33b are arranged in a face-to-back configuration, PC 22 and SC 33a are arranged in a hack-to-back configuration, and SCs 33c and 33d are also arranged in a back-to-back configuration. Note that in the configuration of electronic device 21, BEOL 17 of the outer SRAM chiplets (e.g., SCs 33b and 33d) are facing CBs 12a and 12d, respectively, which may alter (e.g., improve) the data rate of at as some of the signals conducted between the stacked chiplets and the CBs.

As described in FIG. 1 above, electronic device 21 may comprise any suitable number of SRAM chiplets 33 stacked at each side of PC 22.

Figure 3:
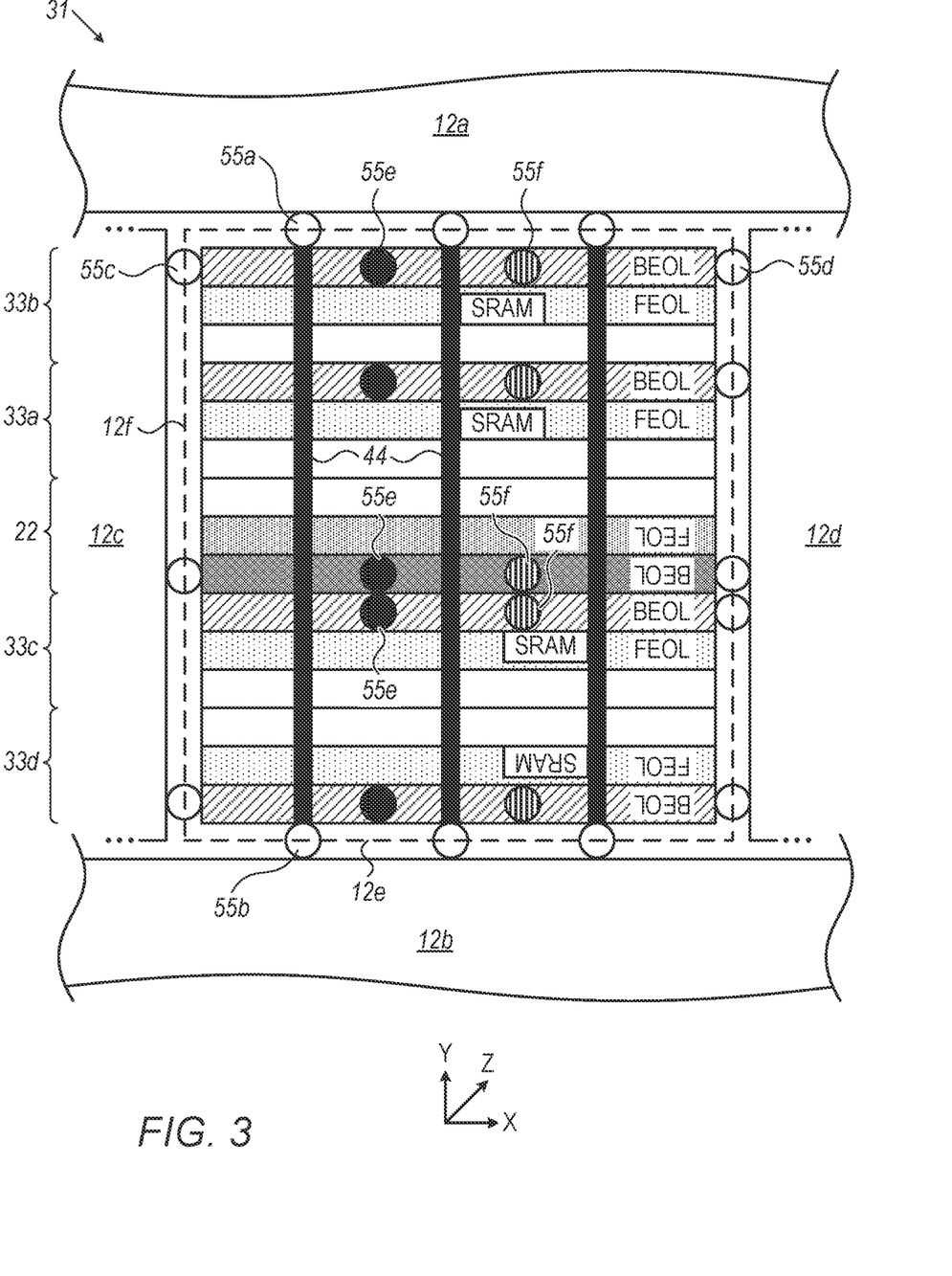

FIG. 3 is a schematic, sectional view of an electronic device 31, in accordance with another embodiment that is described herein.

In some embodiments, the orientation of the chiplets of electronic device 31 (i.e., PC 22 and SCs 33a-33d) is similar to that of electronic device 21, but in other embodiments, the number of chiplets and/or the orientation of at least one of the chiplets may be altered, as described in FIGS. 1 and 2 above.

In some embodiments, electronic device 31 comprises six CBs 12a, 12b, 12c, 12d, 12e and 12f (CBs 12e and 12f are depicted in a phantom view), and six sets of balls 55a, 55b, 55c, 55d, 55e and 55f (balls 55f are depicted in a phantom view), respectively, for electrically connecting between the CBs and the stacked chiplets.

In some embodiments, each CB 12 is facing a respective facet of the stacked chiplets. CBs 12a and 12b are facing 33b and 33d, respectively, as described in FIG. 2 above, and the surfaces of CBs 12a and 12b are typically parallel to the outer surfaces of the BEOLs of SCs 33b and 33d, and typically are also parallel of the outer surfaces of the other chiplets of electronic device 31.

In some embodiments, the outer surfaces of CBs 12c and 12d are typically orthogonal to the face and back sides of PC 22 and SCs 33a-33d, and are electrically connected, via balls 55c and 55d, respectively, to the BEOLs of some or all of the processing and SRAM chiplets of electronic device 31. For example, (i) CB 12c is electrically connected, via balls 55c, to the BEOLs of PC 22 and SCs 33b and 33d, and (ii) CB 12d is electrically connected, via balls 55d, to the BEOLs of PC 22 and the BEOLs of all the SRAM chiplets (e.g., SCs 33a-33d).

In some embodiments, the outer surfaces of CBs 12e and 12f are typically orthogonal to the face and back sides of PC 22 and SCs 33a-33d, and are electrically connected, via balls 55e and 55f, respectively, to all the BEOLs of electronic device 31. Note that CBs 12e and 12f are shown in dashed frames because they are positioned along the Z-axis of the XYZ coordinate system, so that both of them are positioned out of the XY plane of the sectional view of FIG. 3. For example, compared to the stacked chiplets, CB 12e is closer and CB 12f is farther to the viewer of the sectional view of FIG. 3.

In some embodiments, balls 55c-55f are disposed on and are typically connected directly to the BEOLs of the respective stacked chiplets of electronic device 31. In the context of the present disclosure, the term "directly" refers to a connection between a chiplet and a respective ball without using a TSV. Note that in the so-called direct connection, electronic device 31 may comprise one or more layers (e.g., electrically conductive pads) disposed: (i) between CBs 12 and respective balls 55, and (ii) between balls 55 and the BEOLs of the respective chiplets.

In some embodiments, the configurations of electronic device 31 may improve the bandwidth and data rate compared to that of one or both electronic devices 11 and 21. The integration of multiple (e.g., six) CBs 12 shortens the distance for conducting signals, and therefore, may also improve the signal integrity and/or power integrity of such electronic devices. Moreover, the configuration of CBs 12 and balls 55 may be altered depending on the specification of processing and memory capabilities, and the number of processing and SRAM chiplets stacked together in electronic device 31, as also described in detail in FIGS. 1 and 2 above.

The configuration of electronic device 31 is provided by way of example, in order to illustrate certain problems that are addressed by embodiments or the present invention and to demonstrate the application of these embodiments in enhancing the performance of such an electronic device.

Embodiments of the present invention, however, are by no means limited to this specific sort of example electronic device, and the principles described herein may similarly be applied to other sorts of electronic devices shown, for example, in FIGS. 1 and 2 above, or using any other suitable configurations in other suitable types of electronic devices.

Figure 4:
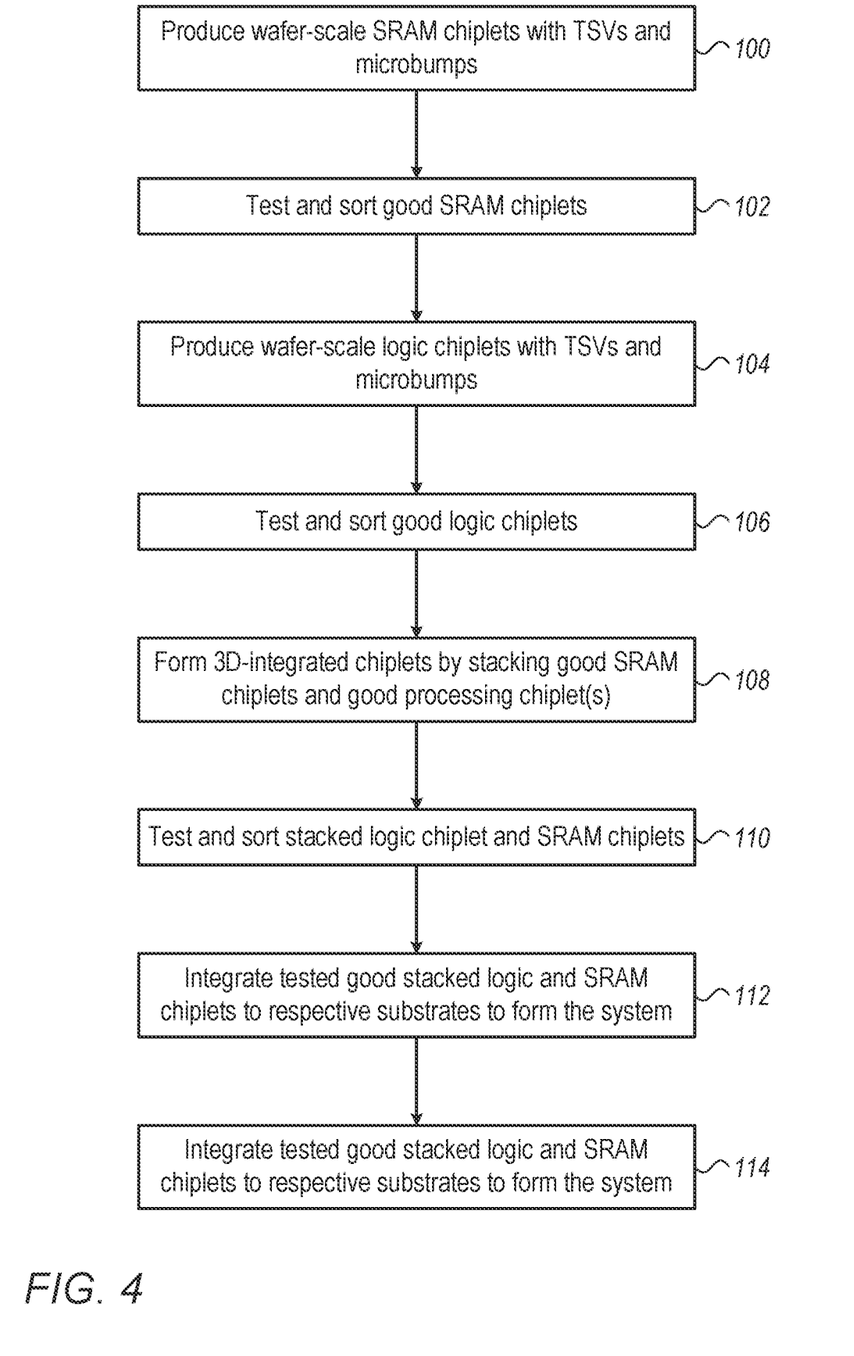
FIG. 4 is a flow chart that schematically illustrates a method for producing the electronic device of FIG. 3, in accordance with an embodiment that is described herein.

FIG. 4 is a flow chart that schematically illustrates a method for producing electronic device 31, in accordance with an embodiment that is described herein. The method begins at a SRAM chiplet formation operation 100 with the production of SCs 33 (e.g., SCs 33a-33d), and the formation of TSVs 44 and bumps 19. Note that operation 100 is carried out in wafer scale (i.e., wafer level), so that multiple (e.g., tens or hundreds of) SRAM dies, including TSVs 44, are formed on the wafer described in FIG. 1 above (e.g., substrate 14), and subsequently, bumps 19 are formed on the surfaces of substrate 14 and BEOL 17 of the SRAM dies. In the context of the present disclosure and in the claims, the term "SRAM die" refers to a SRAM chiplet, after forming TSV s 44 and bumps 19 and before dicing the wafer and forming SCs 33.

At a SRAM testing and sorting operation 102, testing and sorting processes are carried out on all the SRAM dies of the wafer in order to sort in fully functional (also referred to herein as "good") SRAM dies, and to sort out non-functional or partially functional (also referred to herein as "bad") SRAM dies. In some embodiments, the SRAM dies typically have redundancy of memory blocks, so that in response to identifying that a first memory block is non-functional, data intended to be stored in the first memory block, may be stored in a second different memory block. Additionally, or alternatively, various techniques, such as error-correction code (ECC), are applied to the SRAM dies. The redundancy of memory blocks and the ECC are used in order to improve the yield of the SRAM dies (i.e., the number of good SRAM dies per wafer).

In some embodiments, after the testing and sorting, the wafer is diced, and the good SRAM dies are processed to produce SRAM chiplets 33 that are kept for producing electronic device 31.

At a logic chiplet formation operation 104, logic dies that are intended to be used for fabricating processing chiplet 22, are produced in wafer-level, including the formation of TSVs 44 and bumps 19, as described for the SRAM dies in operation 100 above.

At a logic testing and sorting operation 106, testing and sorting processes are carried out on all the logic dies of the wafer in order to sort in fully functional (also referred to herein as "good") logic dies, and to sort out and trash non-functional or partially functional (also referred to herein as "bad") logic dies.

In some embodiments, at least one of and typically all the logic dies have a redundancy of CPU cores, so that given data intended to be processed in a first CPU core that is not functioning, may be transferred for processing in a second CPU core of the same logic die. The CPU-core redundancy features may be used for improving the yield of the logic dies on the wafer, as described for the SPAM dies in operation 102 above.

In some embodiments, after the testing and sorting, the wafer is diced, and the good logic dies are processed to produce processing chiplets 22 that are kept for producing electronic devices 31.

At a 3D integration operation 108, the tested-good PC 22 and the tested-good SCs 33a-33d are stacked together, as shown in the sectional view or electronic device 31 (excluding CBs 12) shown and described in detail in FIG. 3 above.

At a stack testing operation 110, testing and sorting processes are carried out on the stacked chiplets, which is formed in operation 108. In some embodiments, the redundancy in memory and CPU cores, and the FCC techniques are used for improving the yield of the tested the stacked chiplets. Operation 110 is concluded with obtaining one or more units of tested good stacks of PC 22 and SCs 33a-33d, as shown in FIG. 3 above.

At a substrate integration operation 112, balls 55 are produced on the tested good stacks of PC 22 and SCs 33a-33d and/or on CBs 12a-12f, and the tested good stacks of PC 22 and SCs 33a-33d are integrated with CBs 12a-12f, so as to produce electronic device 31 whose structure and functionality is described in FIG. 3 above.

At a final testing operation 114 that concludes the method, electronic device 31 is tested and upon passing the testing successfully, electronic device 31 is ready to be used in any suitable electronic system.

In other embodiments, at least one of the testing and sorting operations (e.g., operations 102, 106, 110 and 114) may be carried out partially (e.g., performing some of the testing on all or some of the dies and/or chiplets and/or electronic devices intended to be tested) or may be skipped in order to reduce the production costs of electronic device 31.

It is noted that the embodiments described above are cited by way of example, and that the present invention is not limited to what has been particularly shown and described hereinabove. Rather, the scope or the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic device, comprising:
 a processing chiplet configured to process data and having a first side and a second side;
 one or more first static random-access memory (SRAM) chiplets disposed on the first side of the processing chiplet and configured to store a first portion of the data;
 one or more second SRAM chiplets disposed on the second side of the processing chiplet and configured to store a second portion of the data;
 one or more first electrical terminals disposed on the first side of the processing chiplet and configured to electrically connect between the first side of the processing chiplet and the one or more first SRAM chiplets;
 one or more second electrical terminals disposed on the second side of the processing chiplet and configured to electrically connect between the second side of the processing chiplet and the one or more second SRAM chiplets; and
 one or more through-silicon vias (TSVs) formed through at least part of the processing chiplet and configured to conduct electrical signals between the processing chiplet and at least one of the first and second electrical terminals.

2. The electronic device according to claim 1, wherein the one or more first SRAM chiplets comprise at least first and second given SRAM chiplets, and wherein the first given SRAM chiplet comprises: (i) a first given side, which is facing the first side of the processing chiplet and is connected to the one or more first electrical terminals, and (ii) a second given side, which is facing the second given SRAM chiplet that is stacked on the first given SRAM chiplet.

3. The electronic device according to claim 2, wherein the first given side of the first given SRAM chiplet is disposed on the one or more first electrical terminals that are configured to exchange at least part of the first portion of the data between the processing chiplet and the first given SRAM chiplet.

4. The electronic device according to claim 2, further comprising one or more third electrical terminals disposed on the second side of the first given SRAM chiplet and configured to electrically connect between the second side of the first given SRAM chiplet and the second given SRAM chiplet.

5. The electronic device according to claim 2, further comprising one or more given TSVs formed through at least part of the first given SRAM chiplet and configured to conduct electrical signals between the processing chiplet and at least one of the first and second given SRAM chiplets.

6. The electronic device according to claim 5, wherein at least one of the TSVs and at least one of the given TSVs differ from one another.

7. The electronic device according to claim 6, wherein the at least one of the TSVs: (i) has a first length through at least part of the processing chiplet, (ii) has a first width along the first side of the processing chiplet, and (iii) contains a first metal layer having a first volume within the processing chiplet, and the at least one of the given TSVs: (a) has a second length through at least part of the first given SRAM chiplet, (b) has a second width along the third side of the first given SRAM chiplet, and (c) contains a second metal layer having a second volume within the first given SRAM chiplet, and wherein at least one of the first and second: (1) lengths, (2) widths, (3) metal layers, and (4) volumes, differ from one another.

8. The electronic device according to claim 2, wherein the processing chiplet is formed on a first substrate and comprises first metal interconnects, and at least the first and second given SRAM chiplets is formed on a second substrate and comprises second metal interconnects.

9. The electronic device according to claim 8, wherein the first side comprises a first surface of the first substrate and the second side comprises the first metal interconnects, and wherein the third side comprises: (i) a second surface of the second substrate, or (ii) the second metal interconnects.

10. The electronic device according to claim 1, wherein the first and second SRAM chiplets comprise first and second numbers of SRAM chiplets, wherein the first and second numbers differ from one another.

11. The electronic device according to claim 1, wherein the first and second SRAM chiplets comprise first and second numbers of SRAM chiplets, wherein the first and second numbers are equal to one another.

12. The electronic device according to claim 1, further comprising at least one of: (i) a first circuit board (CB) substrate facing a first outer SRAM chiplet of the first SRAM chiplets, (ii) a second CB substrate facing a second outer SRAM chiplet of the second SRAM chiplets, and (iii) one or more third CB substrates facing one or more edges of the electronic device, respectively, wherein at least one of the edges is orthogonal to at least one of the first, second and third sides.

13. The electronic device according to claim 12, further comprising third electrical terminals, which are disposed on at least one of the first, second and third CB substrates, and are configured to conduct signals between: (i) at least one of the first, second and third CB substrates, and (ii) at least one of the (a) processing chiplet, (b) one or more of the first SRAM chiplets, and (c) one or more of the second SRAM chiplets.

14. A method for producing an electronic device, the method comprising:
disposing, on a first side of a processing chiplet having the first side and a second side, one or more first static random-access memory (SRAM) chiplets;

disposing, on the second side of the processing chiplet, one or more second SRAM chiplets;

disposing, on the first side of the processing chiplet, one or more first electrical terminals for electrically connecting between the first side of the processing chiplet and the one or more first SRAM chiplets;

disposing, on the second side of the processing chiplet, one or more second electrical terminals for electrically connecting between the second side of the processing chiplet and the one or more second SRAM chiplets; and forming, through at least part of the processing chiplet, one or more through-silicon vias (TSVs) for conducting electrical signals between the processing chiplet and at least one of the first and second electrical terminals.

15. The method according to claim 14, wherein disposing the one or more first SRAM chiplets comprise disposing at least first and second given SRAM chiplets, wherein the first given SRAM chiplet comprises: (i) a first given side, which is disposed for facing the first side of the processing chiplet and is connected to the one or more first electrical terminals, and (ii) a second given side, which is disposed for facing the second given SRAM chiplet that is stacked on the first given SRAM chiplet.

16. The method according to claim 14, further comprising disposing at least one of: (i) a first circuit board (CB) substrate facing a first outer SRAM chiplet of the first SRAM chiplets, (ii) a second CB substrate facing a second outer SRAM chiplet of the second SRAM chiplets, and (iii) one or more third CB substrates facing one or more edges of the electronic device, respectively, wherein at least one of the edges is orthogonal to at least one of the first, second and third sides.

17. The method according to claim 16, further comprising disposing, on at least one of the first, second and third CB substrates, third electrical terminals for conducting signals between: (i) at least one of the first, second and third CB substrates, and (ii) at least one of the (a) processing chiplet, (b) one or more of the first SRAM chiplets, and (c) one or more of the second SRAM chiplets.

18. The method according to claim 14, further comprising testing at least one of the: (i) processing chiplet, (ii) one or more of the first SRAM chiplets, (iii) one or more of the second SRAM chiplets, (iv) a stack comprising the processing chiplet electrically connected to at least one of the first and second SRAM chiplets, and (v) one or more circuit board (CB) substrates electrically connected to the second SRAM chiplets.

* * * * *